(12) United States Patent
Dhanyakumar et al.

(10) Patent No.: US 12,396,235 B2
(45) Date of Patent: Aug. 19, 2025

(54) SEMICONDUCTOR DEVICE AND METHOD FOR FORMING THE SAME

(71) Applicant: TAIWAN SEMICONDUCTOR MANUFACTURING COMPANY, LTD., Hsinchu (TW)

(72) Inventors: Mahaveer Sathaiya Dhanyakumar, Hsinchu (TW); Cheng-Ting Chung, Hsinchu (TW); Chien-Hong Chen, Hsinchu County (TW); Jin Cai, Hsinchu (TW); Chung-Wei Wu, Hsinchu County (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 538 days.

(21) Appl. No.: 17/724,434

(22) Filed: Apr. 19, 2022

(65) Prior Publication Data
US 2023/0335617 A1 Oct. 19, 2023

(51) Int. Cl.
*H10D 64/01* (2025.01)
*H10D 30/01* (2025.01)
*H10D 30/67* (2025.01)
*H10D 84/01* (2025.01)
*H10D 84/03* (2025.01)

(52) U.S. Cl.
CPC ......... *H10D 64/017* (2025.01); *H10D 30/031* (2025.01); *H10D 30/6715* (2025.01); *H10D 30/6729* (2025.01); *H10D 30/6735* (2025.01); *H10D 30/6757* (2025.01); *H10D 64/021* (2025.01); *H10D 84/0128* (2025.01); *H10D 84/013* (2025.01); *H10D 84/0147* (2025.01); *H10D 84/038* (2025.01)

(58) Field of Classification Search
None
See application file for complete search history.

(56) References Cited

U.S. PATENT DOCUMENTS

| | | | |
|---|---|---|---|
| 2020/0075875 A1* | 3/2020 | Vasen | H10K 10/481 |
| 2020/0161574 A1* | 5/2020 | Vasen | H10K 10/84 |
| 2020/0357911 A1* | 11/2020 | Frougier | H01L 29/775 |

OTHER PUBLICATIONS

Dirk König et al., "Modulation Doping of Silicon using Aluminium-induced Acceptor States in Silicon Dioxide", Scientific Reports, vol. 7, 2017, pp. 1-8.
Zuzana Melnikova-Kominkova et al., "Strong and efficient doping of monolayer MoS2 by a graphene electrode", Physical Chemistry Chemical Physics, vol. 21, 2019, pp. 25700-25706.
Carter T. White et al., "Fundamental Properties of Single-Wall Carbon Nanotubes", The Journal of Physical Chemistry B, vol. 109, No. 1, 2005, pp. 52-65.
U.S. Appl. No. 17/527,723, filed Nov. 16, 2021.

* cited by examiner

*Primary Examiner* — Mounir S Amer
(74) *Attorney, Agent, or Firm* — Maschoff Brennan

(57) ABSTRACT

A method includes forming a dielectric layer over a substrate; forming a carbon nanotube (CNT) over the dielectric layer; forming a dummy gate structure over the CNT; forming gate spacers on opposite sidewalls of the dummy gate structure; forming source/drain epitaxy structures on opposite sides of the dummy gate structure and in contact with opposite sidewalls of the CNT; replacing the dummy gate structure with a metal gate structure; and forming source/drain contacts over the source/drain epitaxy structures, respectively.

20 Claims, 17 Drawing Sheets

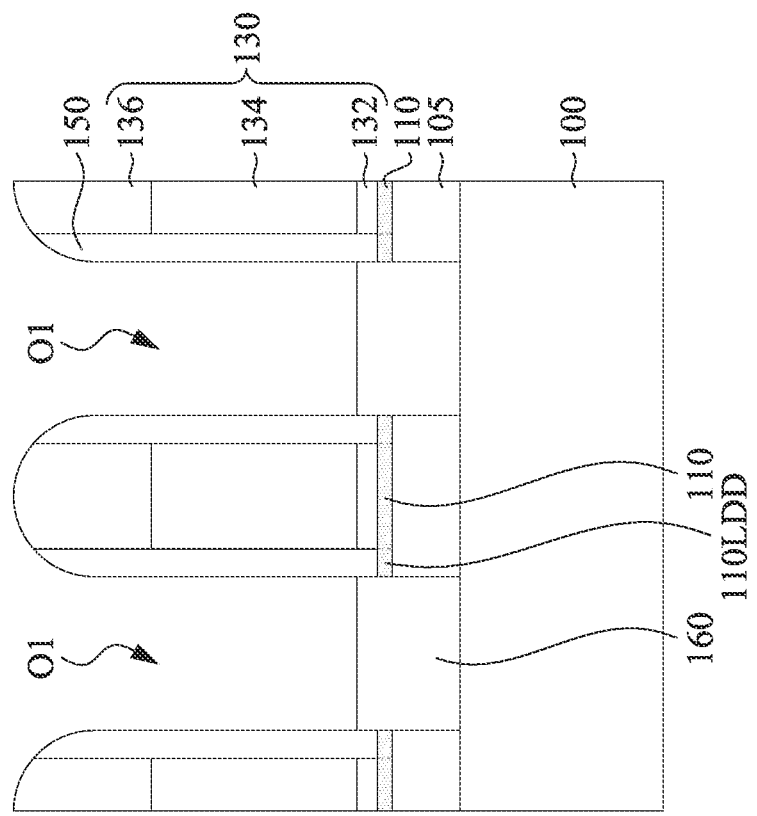
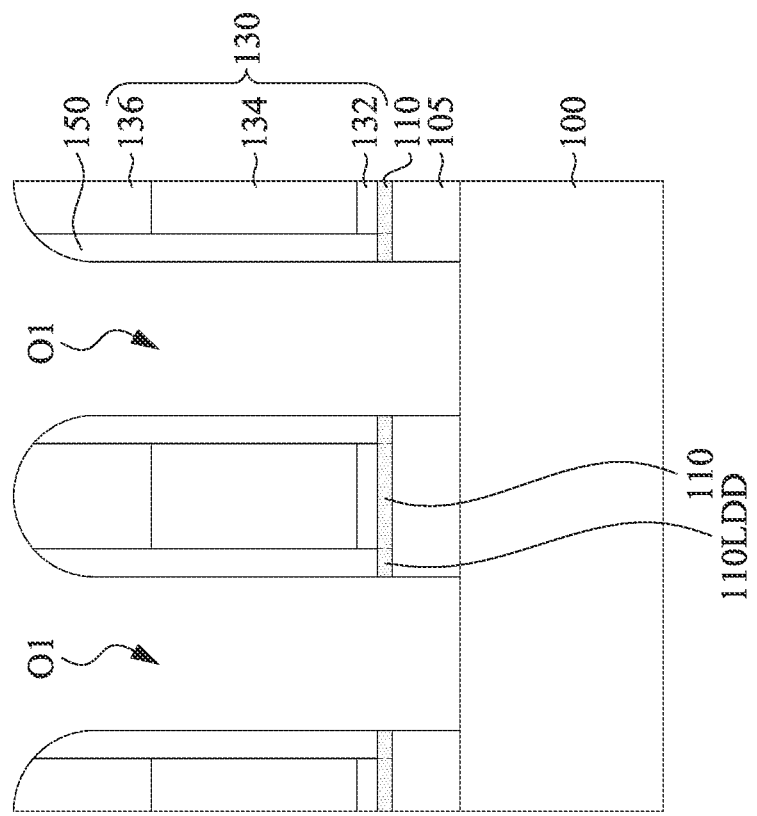

SEMICONDUCTOR DEVICE AND METHOD FOR FORMING THE SAME

BACKGROUND

As the semiconductor industry has progressed into nanometer technology process nodes in pursuit of higher device density, higher performance, and lower costs, challenges from both fabrication and design issues have resulted in the development of three-dimensional designs, such as gate all around (GAA) structures. Non-Si based low-dimensional materials are promising candidates to provide superior electrostatics (e.g., for short-channel effect) and higher performance (e.g., less surface scattering). Carbon nanotubes (CNTs) are considered one such promising candidate due to their high carrier mobility and substantially one dimensional structure.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 4 to 13 show various stages of a sequential manufacturing operation of a semiconductor device in accordance with some embodiments of the present disclosure.

DETAILED DESCRIPTION

Figure 1A:
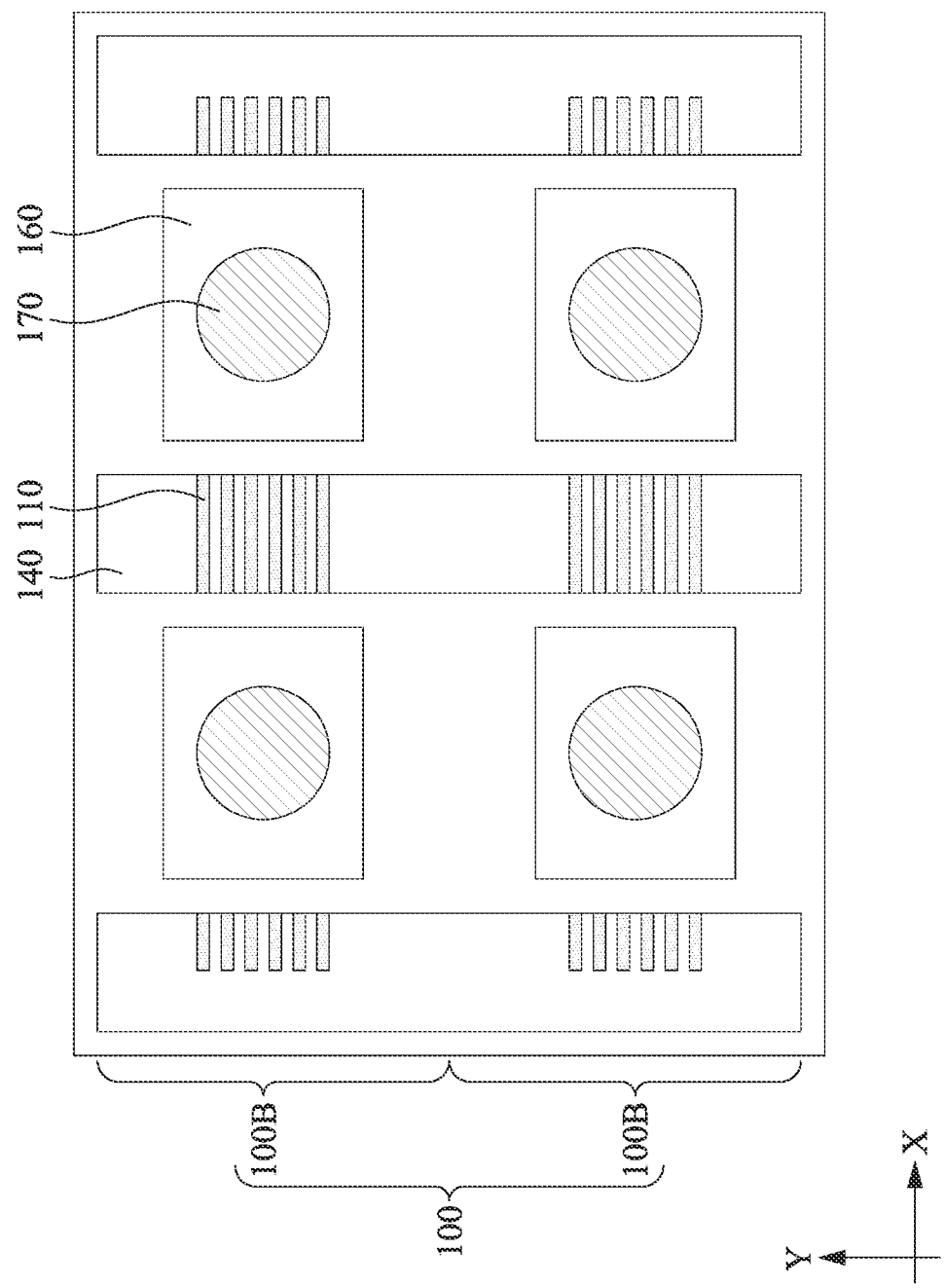
FIG. 1A is a top view of a semiconductor device in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 1B:
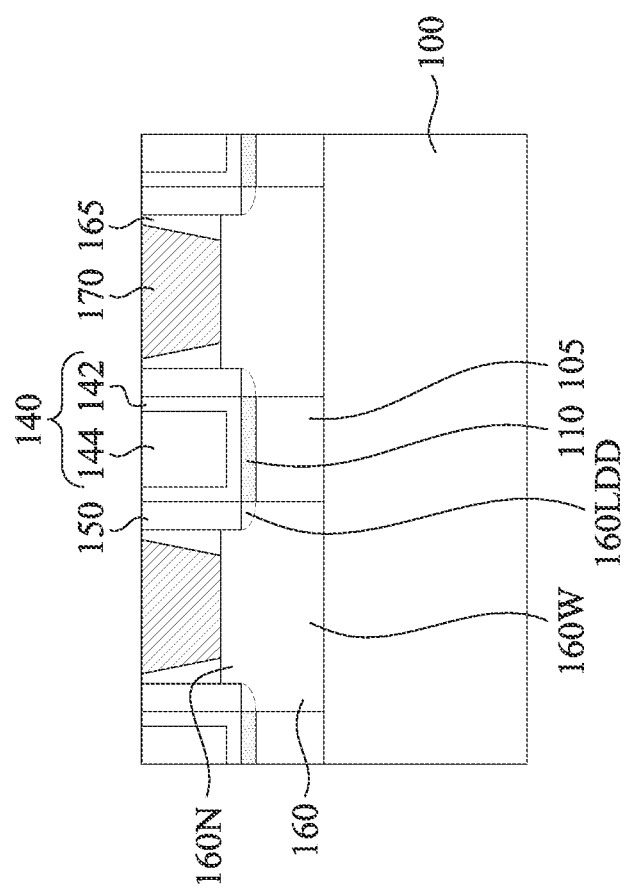
FIG. 1B is a cross-sectional view of a semiconductor device in accordance with some embodiments of the present disclosure.

FIG. 1A is a top view of a semiconductor device in accordance with some embodiments of the present disclosure. FIG. 1B is a cross-sectional view of a semiconductor device in accordance with some embodiments of the present disclosure. In greater details, FIG. 1B is the cross-sectional view along line B-B of FIG. 1A. It is noted that some elements of FIG. 1B are not illustrated in FIG. 1A for clarity. Moreover, it is noted that the embodiments, of FIGS. 1A and 1B use a front-gate device as an example, while the structure can also be a back-gate device in other embodiments.

Reference is made to FIGS. 1A and 1B. Shown there is a substrate 100. The substrate 100 is made of a suitable elemental crystalline semiconductor, such as silicon, diamond or germanium; a suitable alloy or compound crystalline semiconductor, such as Group-IV compound semiconductors (e.g., silicon germanium (SiGe), silicon carbide (SiC), silicon germanium carbide (SiGeC), GeSn, SiSn, SiGeSn), Group III-V compound semiconductors (e.g., gallium arsenide, indium gallium arsenide (InGaAs), indium arsenide, indium phosphide, indium antimonide, gallium arsenic phosphide, or gallium indium phosphide), or the like. In some embodiments, crystalline silicon is used as the substrate 100.

In FIG. 1A, the substrate 100 includes a first region 100A and a second region 100B. In some embodiments, an N-type device (e.g., NFET) is disposed over the first region 100A, while a P-type device (e.g., PFET) is disposed over the second region 100B. Alternatively, in some other embodiments, a P-type device (e.g., PFET) is disposed over the first region 100A, while an N-type device (e.g., NFET) is disposed over the second region 100B.

In FIG. 1B, a dielectric layer 105 is disposed over the substrate 100. The dielectric layer 105 may be an insulating material, which is utilized to isolate devices formed on the substrate 100. In some embodiments, the dielectric layer 105 is a dielectric material such as silicon oxide, aluminum oxide, combinations thereof, or the like. In some embodiments, the thickness of the dielectric layer 105 is in a range from about 10 nm to about 100 nm.

One or more carbon nanotubes (CNTs) 110 are arranged over the substrate 100 and are disposed on the dielectric layer 105. Each of the CNTs 110 may serve as channel region in a semiconductor device, and thus the CNTs 110 can also be referred to CNT channel. As shown in FIG. 1A, the CNTs are arranged over the substrate and aligned with substantially the same direction (e.g., Y direction). The CNTs 110 are laterally stacked over the substrate 100 along a direction (e.g., Y direction) that is perpendicular to the lengthwise direction of the CNTs 110 (e.g., X direction). In FIG. 1B, the CNTs 110 are disposed over the dielectric layer 105, and are vertically separated from the substrate 100 by the dielectric layer 105. In some embodiments, the average diameter of the CNTs 110 is in a range from about 0.7 nm to about 2.0 nm, or may be in a range from about 0.5 nm to about 2.0 nm. In some embodiments of FIG. 1B, the CNTs 110 and the dielectric layer 105 may include substantially the same width. For example, sidewalls of the CNTs 110 may be aligned with sidewalls of the dielectric layer 105. In some other embodiments, the CNTs 110 and the dielectric layer 105 may include different widths.

Figure 1C:
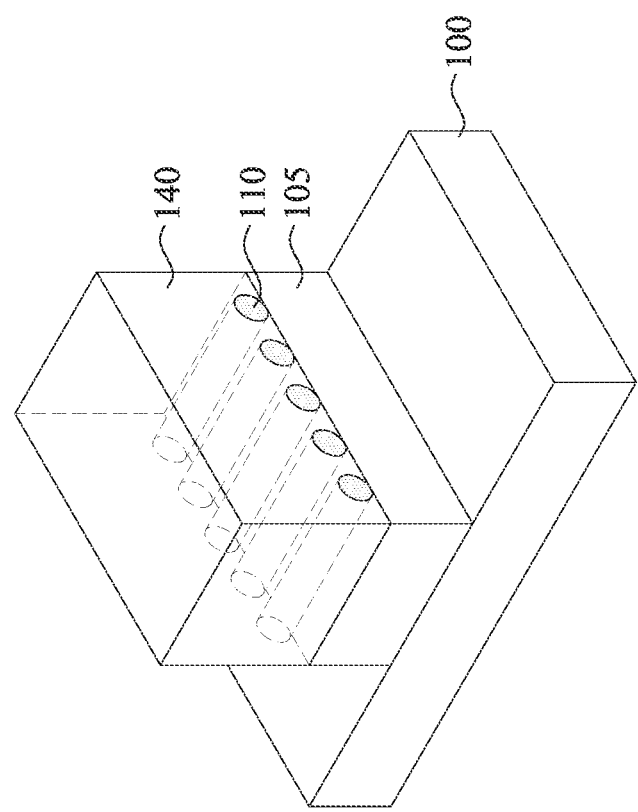
FIG. 1C is a schematic view of a semiconductor device in accordance with some embodiments of the present disclosure.

Gate structures 140 are disposed over the substrate 100. As shown in FIG. 1A, each of the gate structures 140 may cross over the CNTs 110. FIG. 1C shows embodiments that each of the gate structures 140 may wrap around the CNTs 110. It is noted that although the embodiments of FIGS. 1A to 1C illustrate that the CNTs 110 are laterally stacked over the substrate 100, the CNTs 110 may also be vertically stacked over the substrate 100 in some embodiments.

The gate structures 140 may include a gate dielectric layer 142 and a gate electrode 144 over the gate dielectric layer 142. In some embodiments, the gate dielectric layer 142 includes one layer of high-k dielectric. In some other embodiments, the gate dielectric layer 142 includes multi-layer structure, such as an interfacial layer and a high-k dielectric material. Examples of high-k dielectric material include $HfO_2$, HfSiO, HfSiON, HfTaO, HfTiO, HfZrO, zirconium oxide, aluminum oxide, titanium oxide, hafnium dioxide-alumina ($HfO_2$—$Al_2O_3$) alloy, other suitable high-k dielectric materials, and/or combinations thereof. The thickness of the high-k dielectric material may be in a range from about 1 nm to about 10 nm. Examples of interfacial layer include silicon oxide ($SiO_2$), silicon nitride (SiN), silicon oxynitride (SiON), hBN, aluminum oxide ($Al_2O_3$), other suitable dielectric material, and/or combinations thereof. The thickness of the interfacial layer may be in a range from about 0.5 nm to about 2 nm. The gate dielectric layer 142 may be formed by CVD, ALD or any suitable method. In one embodiment, the gate dielectric layer 142 is formed using a highly conformal deposition process such as ALD in order to ensure the formation of a gate dielectric layer having a uniform thickness around each of the CNTs 110.

In some embodiments, the gate electrode 144 includes a conductive material and may be selected from a group comprising of polycrystalline-silicon (poly-Si), poly-crystalline silicon-germanium (poly-SiGe), metallic nitrides, metallic silicides, metallic oxides, and metals. Examples of metallic nitrides include tungsten nitride, molybdenum nitride, titanium nitride, and tantalum nitride, or their combinations. Examples of metallic silicide include tungsten silicide, titanium silicide, cobalt silicide, nickel silicide, platinum silicide, erbium silicide, or their combinations. Examples of metallic oxides include ruthenium oxide, indium tin oxide, or their combinations. Examples of metals include tantalum, tungsten, titanium, aluminum, copper, molybdenum, nickel, platinum, etc. In some embodiments, the gate electrode 144 may be deposited by CVD, ALD, sputter deposition, or other techniques known and used in the art for depositing conductive materials. The thickness of the gate electrode 144 may be in a range from about 5 nm to about 40 nm.

As shown in FIG. 1B, gate spacers 150 are disposed on opposite sidewalls of each of the gate structures 140. In some embodiments, the gate spacers 150 may be formed by insulating dielectric material, such as a silicon nitride-based material. Examples of the silicon nitride-based material can be SiN, SiON, SiOCN or SiCN and combinations thereof. In some other embodiments, the insulating material is one of SiOC, SiCON and SiCN. In some embodiments, the thickness of the gate spacers 150 is in a range from about 2 nm to about 10 nm.

Source/drain epitaxy structures 160 are disposed over the substrate 100 and on opposite sides of the gate structure 140. As shown in FIG. 1B, the source/drain epitaxy structures 160 may be in contact with the dielectric layer 105 and the CNTs 110. In some embodiments of FIG. 1B, the source/drain epitaxy structures 160 may be in contact with bottom surfaces of the gate spacers 150. Stated another way, the source/drain epitaxy structures 160 may extend to positions that are vertically under the corresponding gate spacers 150.

In FIG. 1B, each of the source/drain epitaxy structures 160 may include a wider portion 160W and a narrower portion 160N over the wider portion 160W. The wider portion 160W of the source/drain epitaxy structures 160 is below the bottom surfaces of the gate spacers 150 and is in contact with the substrate 100, the CNTs 110, and the dielectric layer 105. On the other hand, the narrower portion 160N of the source/drain epitaxy structures 160 is in contact with sidewalls of the gate spacers 150.

In some embodiments, the source/drain epitaxy structures 160 may include lightly-doped regions 160LDD. In some embodiments, the lightly-doped regions 160LDD are located in the wider portion 160W of the source/drain epitaxy structures 160, and are in contact with the CNTs 110. In some other embodiments, the lightly-doped regions 160LDD may be in contact with the bottom surfaces of the corresponding gate spacers 150. Here, the lightly-doped regions 160LDD may be referred to as regions of the source/drain epitaxy structures 160 that have lower dopant concentration than other regions of the source/drain epitaxy structures 160. For example, the lightly-doped regions 160LDD may include lower dopant concentration than the narrower portion 160N of the source/drain epitaxy structures 160. As a result, the narrower portion 160N of the source/drain epitaxy structures 160 can also be referred to as a heavily-doped region.

In some embodiments, the source/drain epitaxy structures 160 may include Si, SiGe, Ge, III-V materials, or the like. In some embodiments, the source/drain epitaxy structures 160 may include epitaxial material for N-type device (e.g., NFET), such as SiP, SiAs, SiC, or the like. On the other hand, the source/drain epitaxy structures 160 may include epitaxial material for P-type device (e.g., PFET), such as SiGeB, SiCB, or the like. In some embodiments, the source/drain epitaxy structures 160 may include dopant such as Ge, C, P, As, B, or the like.

Source/drain contacts 170 are disposed over and in contact with the source/drain epitaxy structures 160. In some embodiments, the source/drain contacts 170 may include conductive material such as W, Co, Ru, TiN, Ti, TaN, Ta, Al, Mo, Ag, Sc, Hf, Sn, Au, Pt, Pd, or combinations thereof. The source/drain contacts 170 may include single layer structure or multi-layer structure. In some embodiments where each of the source/drain contacts 170 is a multi-layer structure, the source/drain contacts 170 each may include a liner and a filling metal over the liner. Examples of the liner can be TiN, Ti, TaN, Ta, or the like. Examples of the filling metal can be W, Cu and Co, or the like.

As shown in FIG. 1B, contact etch stop layer (CESL) 165 may be disposed over the Source/drain contacts 170 are disposed over and in contact with the source/drain epitaxy structures 160 and extending to sidewalls of the gate spacers 150. In some embodiments, the CESL 165 may also extend along sidewalls of the source/drain contacts 170. The CESL 165 may be made of a dielectric material, such as silicon nitride, silicon carbide, or the like, or a combination thereof.

Figure 2:
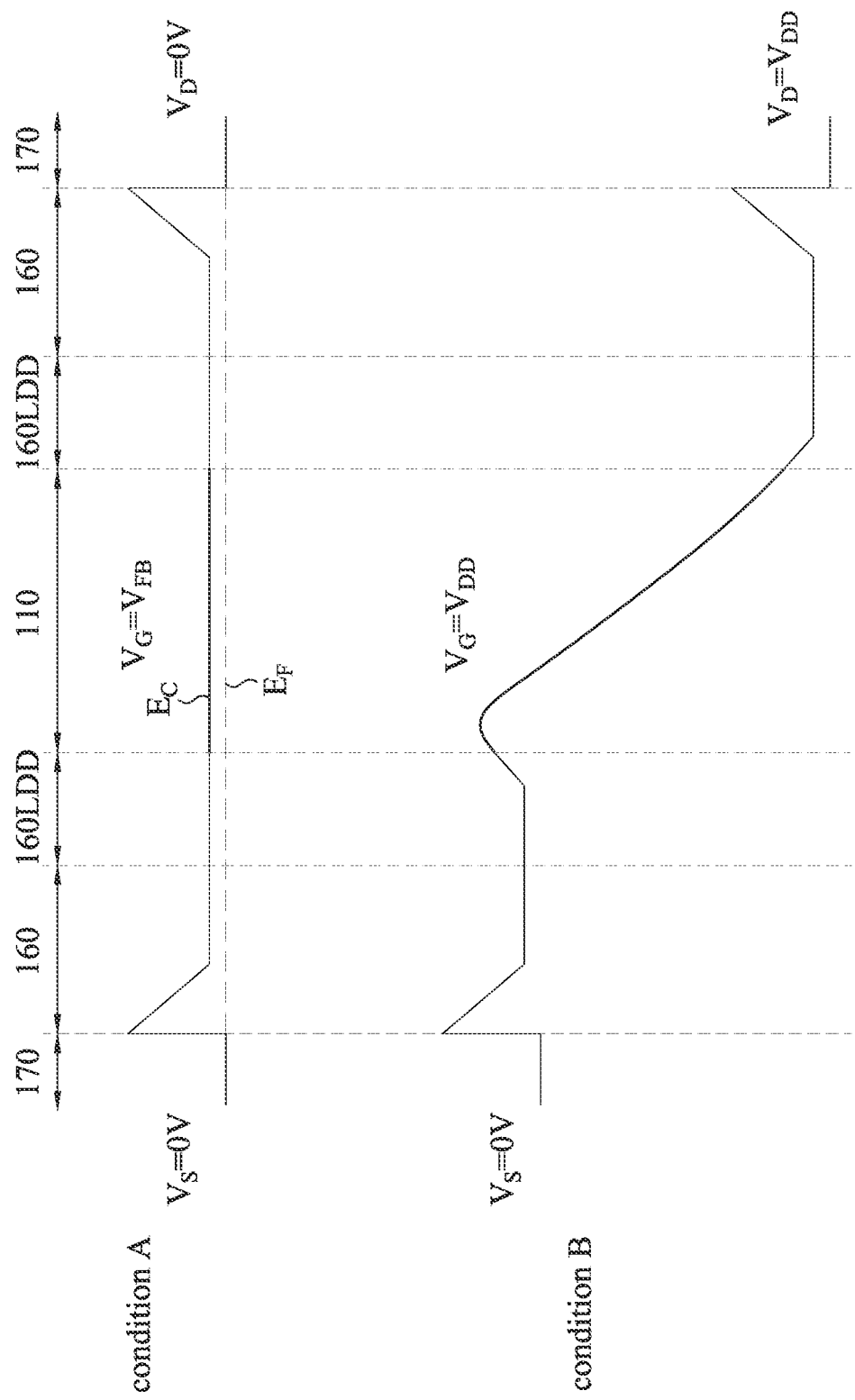
FIG. 2 illustrates band structures of a semiconductor device in accordance with some embodiments of the present disclosure.

FIG. 2 illustrates band structures of a semiconductor device in accordance with some embodiments of the present disclosure. In greater detail, FIG. 2 shows the band structure along the source/drain contact 170, the source/drain epitaxy structure 160, the lightly-doped region 160LDD, the CNT 110, the lightly-doped region 160LDD, the source/drain epitaxy structure 160, and the source/drain contact 170 of the device of FIG. 1B. In some embodiments, the source/drain epitaxy structure 160 on the left side of FIG. 2 can be referred to as source epitaxy structure 160, and thus the source/drain contact 170 on the left side of FIG. 2 can be referred to as source contact 170. On the other hand, the source/drain epitaxy structure 160 on the right side of FIG. 2 can be referred to as drain epitaxy structure 160, and thus the source/drain contact 170 on the right side of FIG. 2 can be referred to as drain contact 170.

In condition A of FIG. 2, the band structure under a flat band condition is illustrated. In condition A, the voltage Vs applied to the source contact 170 (left side) and the voltage VD applied to the drain contact 170 (right side) are set to 0V. The gate voltage VG is set to flat band voltage $V_{FB}$. It can be seen that the conduction band of the CNT 110 is aligned with the conduction bands of lightly-doped regions 160LDD on opposite sides of the CNT 110.

In condition B of FIG. 2, when the voltage VD applied to the drain contact 170 (right side) and the gate voltage $V_G$ are set to $V_{DD}$, the conduction band of the CNT 110 is also aligned with the conduction bands of lightly-doped regions 160LDD on opposite sides of the CNT 110.

The band alignment can reduce the contact resistance at CNT 110, and will improve the device performance. This is due to the present of the source/drain epitaxy structures 160, which are located between the CNT 110 and the source/drain contacts 170. The conduction bands of the source/drain epitaxy structures 160, which are made of semiconductor material, such as silicon-based or germanium-based materials, can be tuned by doping the source/drain epitaxy structures 160, and thus the band alignment can be achieved. However, if the source/drain epitaxy structures 160 are omitted, the CNT 110 will be in direct contact with the source/drain contacts 170, which in turn will increase the contact resistance at the interfaces between the CNT 110 and the source/drain contacts 170. In some embodiments, the estimated contact resistance between the CNT 110 and the source/drain epitaxy structures 160 is about 0.72 KΩ, while the estimated contact resistance between the CNT 110 and the source/drain contacts 170 (when the source/drain epitaxy structures 160 are omitted) is about 4.5 KΩ. Accordingly, by inserting the source/drain epitaxy structures 160 between the CNT 100 and the source/drain contacts 170, the contact resistance at the CNT 100 can be significantly reduced.

In some embodiments, the band alignment of the CNT 100 and the source/drain epitaxy structures 160 can be achieved by several ways. First, doping the source/drain epitaxy structures 160 will create shallow states in the band-gap, in which the shallow states have small ionisation energies. In some embodiments, if the dopant concentration is high, the dopant states will create a band that is close to the conduction band, which will effectively decrease the band-gap of the source/drain epitaxy structures 160. Moreover, the lightly-doped regions 160LDD of the source/drain epitaxy structures 160 are formed in contact with opposite sides of the CNT 110, and will facilitate band alignment with the CNT 110. In some embodiments where the lightly-doped regions 160LDD are omitted in FIG. 1B, the estimated drain current $I_{deff}$ may be degraded by about 30%.

Moreover, the conduction band of the CNT 110 can be tuned by adjusting the diameter of CNT 110. Generally, there are three types of CNT structures based on chirality: armchair, zigzag, and chiral. Chirality can be used to adjust the diameter of the CNT 110. In some embodiments, the average diameter of the CNT 110 is in a range from about 0.7 nm to about 2.0 nm, such range will result in a satisfied bang-gap of the CNT 110 for band alignment with the source/drain epitaxy structures 160.

It is noted that the discussion of FIG. 2 uses an N-type device as an example. If the device is a P-type device, the band alignment can be achieved by tuning the valence bands of the CNT 110 and the source/drain epitaxy structures 160.

As mentioned above, the substrate 100 includes a first region 100A and a second region 100B. An N-type device (e.g., NFET) is disposed over the first region 100A, while a P-type device (e.g., PFET) is disposed over the second region 100B. Alternatively, in some other embodiments, a P-type device (e.g., PFET) is disposed over the first region 100A, while an N-type device (e.g., NFET) is disposed over the second region 100B. Here, the N-type device is referred to as a device using electrons as majority carriers in channel, while the P-type device is referred to as a device using holes as majority carriers in channel. In some embodiments, the N-type device can be formed by doping the source/drain epitaxy structures 160 with N-type dopants, while the P-type device can be formed by doping the source/drain epitaxy structures 160 with P-type dopants. In some embodiments, the CNTs 110 of an N-type device (e.g., NFET) over the substrate 100 and the CNTs 110 of a P-type device (e.g., PFET) over the substrate 100 may include single diameter. That is, diameter of the CNTs 110 of an N-type device (e.g., NFET) over the substrate 100 may be substantially the same as diameter of the CNTs 110 of a P-type device (e.g., PFET).

Figure 3A:
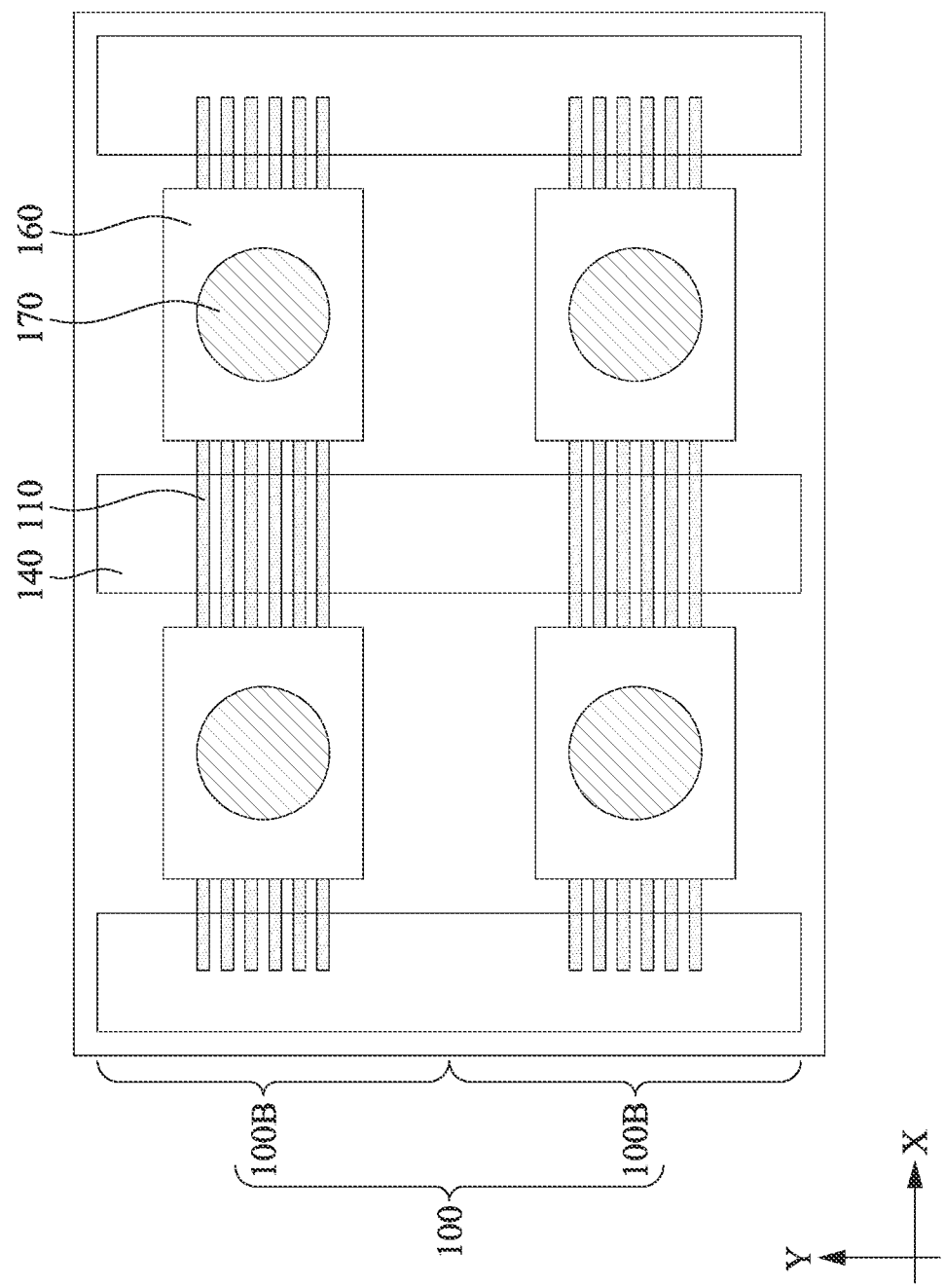
FIG. 3A is a top view of a semiconductor device in accordance with some embodiments of the present disclosure.
Figure 3C:
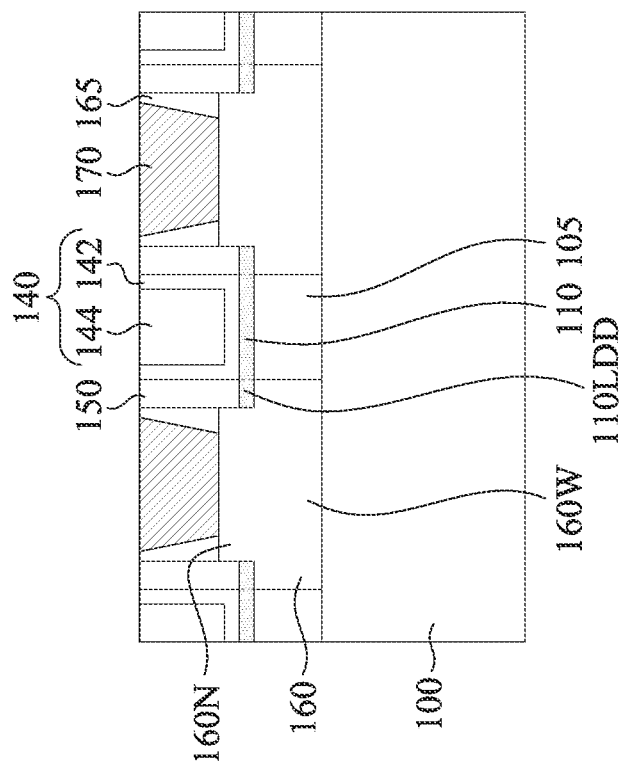
FIGS. 3B to 3C are cross-sectional views of semiconductor devices in accordance with some embodiments of the present disclosure.
Figure 3B:
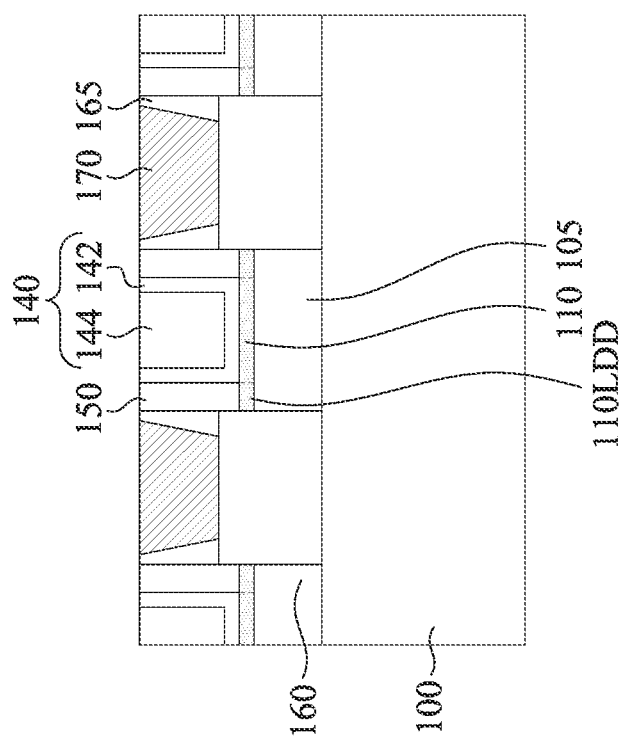

FIG. 3A is a top view of a semiconductor device in accordance with some embodiments of the present disclosure. FIGS. 3B and 3C are cross-sectional views of a semiconductor device in accordance with some embodiments of the present disclosure. In greater details, FIGS. 3B and 3C are different embodiments of cross-sectional views along line B-B of FIG. 3A. It is noted that some elements of FIGS. 3B and 3C are not illustrated in FIG. 3A for clarity. Moreover, some elements of FIGS. 3A to 3C may be similar to those described in FIGS. 1A and 1B, such elements are labeled the same, and relevant details will not be repeated for brevity.

The embodiments of FIGS. 3A to 3C are different from the embodiments of FIGS. 1A and 1B, in that each of the CNTs 110 of FIGS. 3A to 3C is longer than the gate structures 140 along the lengthwise direction of CNTs 110. For example, as shown in FIGS. 3B and 3C, the CNTs 110 may be wider than the gate structure 140, and may extend to bottom surfaces of the gate spacers 150. In such embodiments, opposite ends of the CNTs 110 may be vertically aligned with outer sidewall of the respective gate spacers 150.

In some embodiments of FIGS. 3A to 3C, each of the CNTs 110 may include lightly-doped regions 110LLD on opposite sides of each of the CNTs 110. For example, as shown in FIGS. 3B and 3C, the lightly-doped regions 110LLD may be located at opposite portions of each of the CNTs 110 that are under the gate spacers 150, while portion of each of the CNTs 110 that is under the gate structure 140 may be un-doped region. In some embodiments, the portion of each of the CNTs 110 that is under the gate structure 140 may also be referred to as a channel portion. In some embodiments, the dopant concentration of the lightly-doped regions 110LLD of the CNTs 110 is higher than the channel portion of the CNTs 110.

Furthermore, the embodiments of FIGS. 3A to 3C are different from the embodiments of FIGS. 1A and 1B, in that the epitaxy structures 160 of FIGS. 3A to 3C do not include lightly-doped region (e.g., the lightly-doped regions 160LDD of FIG. 1B).

In the embodiments of FIG. 3B, the dielectric layer 105 and the CNTs 110 has substantially the same width. As a result, sidewalls of the CNTs 110 may be aligned with sidewalls of the dielectric layer 105. Furthermore, different from embodiments of FIG. 1B, each of the epitaxy structures 160 in FIG. 3B may include substantially uniform width. For example, the gate spacers 150 may not overlap the epitaxy structures 160 along the vertical direction.

In the embodiments of FIG. 3C, the dielectric layer 105 is narrower than the CNTs 110. That is, portions of the epitaxy structures 160 may extend to positions that are vertically under the CNTs 110. For example, the epitaxy structures 160 of FIG. 3C may be similar to the epitaxy structures 160 described in FIG. 1B, which includes a wider portion 160W and a narrower portion 160N over the wider portion 160W. However, in the cross-sectional view of FIG. 3C, the wider portion 160W of the epitaxy structures 160 may be vertically separated from the bottom surfaces of the gate spacers 150 by the CNTs 110.

Embodiments of FIGS. 3A to 3C provide another way to reduce contact resistance at the CNTs 100. For example, the opposite ends of each CNT 110 are doped to form lightly-doped regions 110LLD, and will facilitate band alignment between the CNT 110 and the source/drain epitaxy structures 160. In some embodiments, the estimated contact resistance between the CNT 110 and the source/drain epitaxy structures 160 is about 0.72 KΩ, while the estimated contact resistance between the CNT 110 and the source/drain contacts 170 (when the source/drain epitaxy structures 160 are omitted) is about 4.5 KΩ. Accordingly, by inserting the source/drain epitaxy structures 160 between the CNT 110 and the source/drain contacts 170, and by further forming lightly-doped regions in the CNT 110, the contact resistance at the CNT 100 can be significantly reduced.

FIGS. 4 to 13 show various stages of a sequential manufacturing operation of a semiconductor device in accordance with some embodiments of the present disclosure. In greater details, FIGS. 4 to 13 illustrate a method for forming the structure shown in FIG. 3B. It is noted that relevant structural details will not be repeated for brevity.

Figure 4:
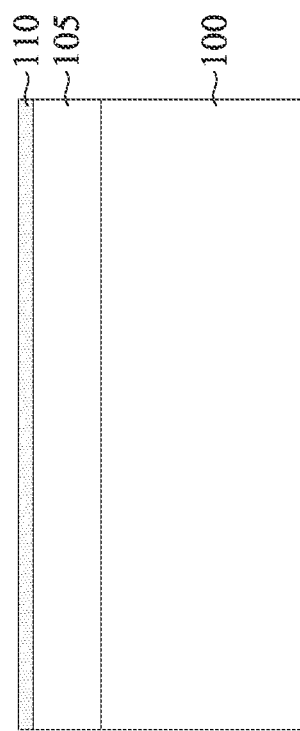

Reference is made to FIG. 4. A dielectric layer 105 is deposited over a substrate 100, and a CNT 110 is formed over the dielectric layer 105. It is noted that, although one CNT 110 is illustrated in FIG. 4, numbers of CNTs 110 may be formed over the substrate 100 as shown in FIG. 3A. The dielectric layer 105 may be deposited onto the substrate 100 using a deposition process such as chemical vapor deposition, sputtering, atomic layer deposition, combinations of these, or the like. However, any suitable material and any suitable deposition process may be utilized.

The CNT 110 can be formed by various methods, such as arc-discharge or laser ablation methods, or a templated CVD method on a substrate. The formed CNTs can be dispersed in a solvent, such as sodium dodecyl sulfate (SDS). The CNTs can be transferred to and disposed on a substrate using various methods, such as a floating evaporative self-assembly method in some embodiments.

Figure 5:
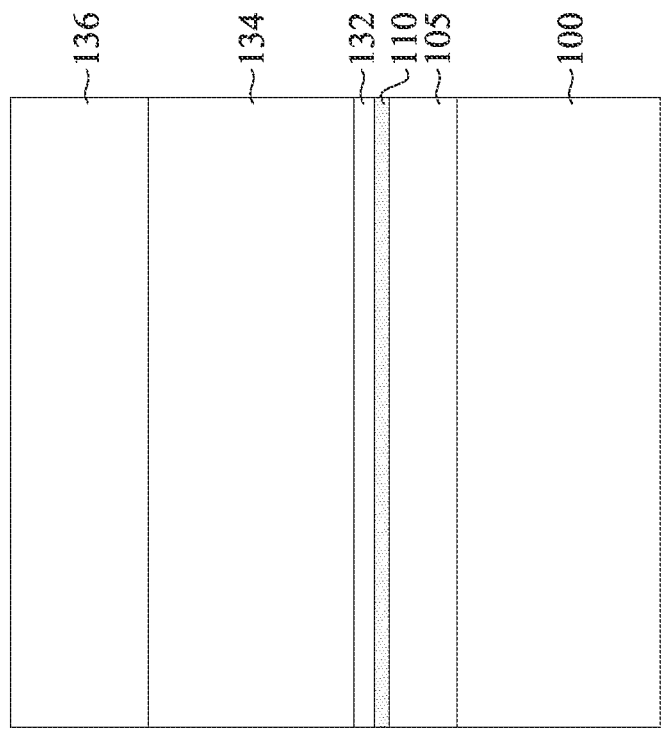

Reference is made to FIG. 5. A gate dielectric layer 132, which includes silicon oxide, silicon nitride, or the like, may be deposited over the CNT 110. Next, a dummy gate layer 134, such as amorphous silicon, polycrystalline silicon, or the like, may be deposited over the gate dielectric layer 132 and then planarized (e.g., by CMP). A hard mask 136, such as silicon nitride, silicon carbide, or the like, may be formed over the dummy gate layer 134. The materials used to form the gate dielectric layer 132, the dummy gate layer 134, and hard mask 136 may be deposited using any suitable method such as CVD, plasma-enhanced CVD (PECVD), atomic layer deposition (ALD), plasma-enhanced ALD (PEALD) or the like, or combinations thereof.

Figure 6:
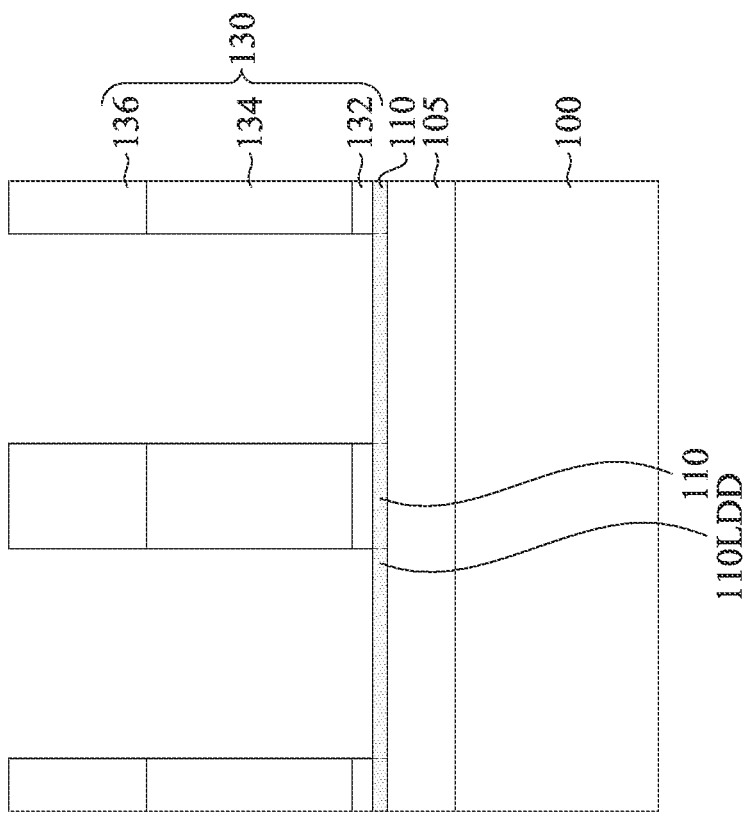

Reference is made to FIG. 6. The gate dielectric layer 132, the dummy gate layer 134, and hard mask 136 may be patterned to form dummy gate structures 130. In some embodiments, the dummy gate structures 130 may be formed by, for example, forming a patterned photoresist layer over the hard mask 136, which includes openings that expose unwanted portions of the gate dielectric layer 132, the dummy gate layer 134, and hard mask 136, and then performing an etching process to remove the unwanted portions of the gate dielectric layer 132, the dummy gate layer 134, and hard mask 136 through the openings of the patterned photoresist layer. Each of the dummy gate structures 130 includes remaining portions of the gate dielectric layer 132, the dummy gate layer 134, and hard mask 136.

In some embodiments, after the gate structures 130 are formed, lightly-doped regions 110LDD may be formed in the CNT 110 by doping portions of the CNT 110 that are uncovered by the gate structures 130. In some embodiments, the CNT 110 can be doped by suitable process, such as molecular doping, ion implantation, or the like.

Figure 7:
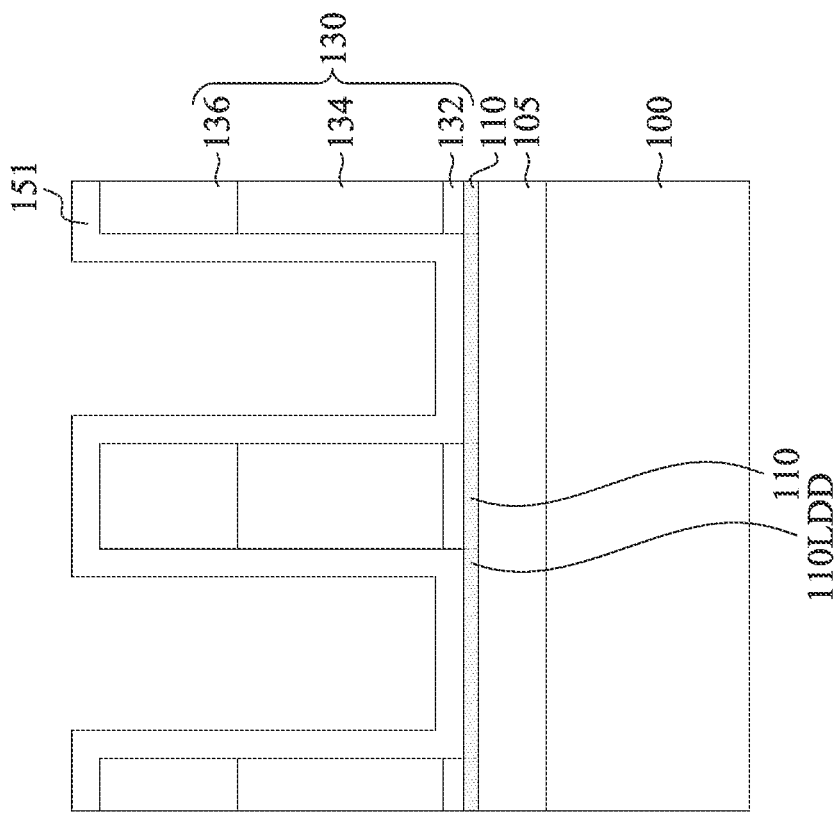

Reference is made to FIG. 7. A spacer layer 151 is deposited blanket over the structure of FIG. 6. In greater details, the spacer layer 151 is formed lining exposed surfaces of the dummy gate structures 130 and lining exposed surfaces of the CNT 110. In some embodiments, the spacer layer 151 may be deposited using any suitable method such as CVD, plasma-enhanced CVD (PECVD), atomic layer deposition (ALD), plasma-enhanced ALD (PEALD) or the like, or combinations thereof.

In some embodiments, the lightly-doped regions 110LDD are not formed in the stage of FIG. 6. Instead, the lightly-doped regions 110LDD may be formed after the spacer layer 150 are deposited over the structure of FIG. 6. In some embodiments, the lightly-doped regions 110LDD may be formed by using charged spacer. For example, the spacer layer 150 may be doped, such that the spacer layer 150 becomes a donor type spacer or an acceptor type spacer. If the spacer layer 150 is an acceptor type spacer (doped with B, Al, Ga, In, or the like), the spacer layer 150 may include acceptor states that can capture electrons from portions of the CNT 110, while leaving holes to the portions of CNT 110 as majority charge carriers for P-type device. Similarly, if the spacer layer 150 is a donor type spacer (doped with P, As, Sb, or the like), the spacer layer 150 may include donor states that can capture holes from portions of the CNT 110, while leaving electrons to the portions of CNT 110 as majority charge carriers for N-type device. Here, the portions of the CNT 110 with charge carriers can be referred to as the lightly-doped regions 110LDD.

Reference is made to FIG. 8. An etching process is performed to remove horizontal portions of the spacer layer 151 (see FIG. 7), while leaving vertical portions of the spacer layer 151 remaining on sidewalls of the dummy gate structures 130. The remaining portions of the spacer layer 151 may be referred to as gate spacers 150.

The etching process further removes portions of the CNT 110 and portions of the dielectric layer 105 that are not covered by the dummy gate structures 130 and the gate spacers 150 until top surface of the substrate 100 is exposed. As a result, openings O1 are formed in the dielectric layer 105. In some embodiments, the etching process may include an anisotropic etching process, such as dry etch. Accordingly, after the etching process, sidewalls of the gate spacers 150, the CNT 110, and the dielectric layer 105 may be aligned with each other.

Reference is made to FIG. 9. Source/drain epitaxy structures 160 are formed in the openings O1 of the dielectric layer 105. In some embodiments, the source/drain epitaxy structures 160 may overfill the openings O1 of the dielectric layer 105 such that top surfaces of the source/drain epitaxy structures 160 may be higher than top surface of the CNT 110, such that the source/drain epitaxy structures 160 are in contact with sidewalls of the gate spaces 150. In some embodiments, the source/drain epitaxy structures 160 may be formed by selective epitaxial growth (SEG). In some embodiments, the epitaxy structures 160 may be doped with p-type dopants or n-type dopants.

Figure 10:
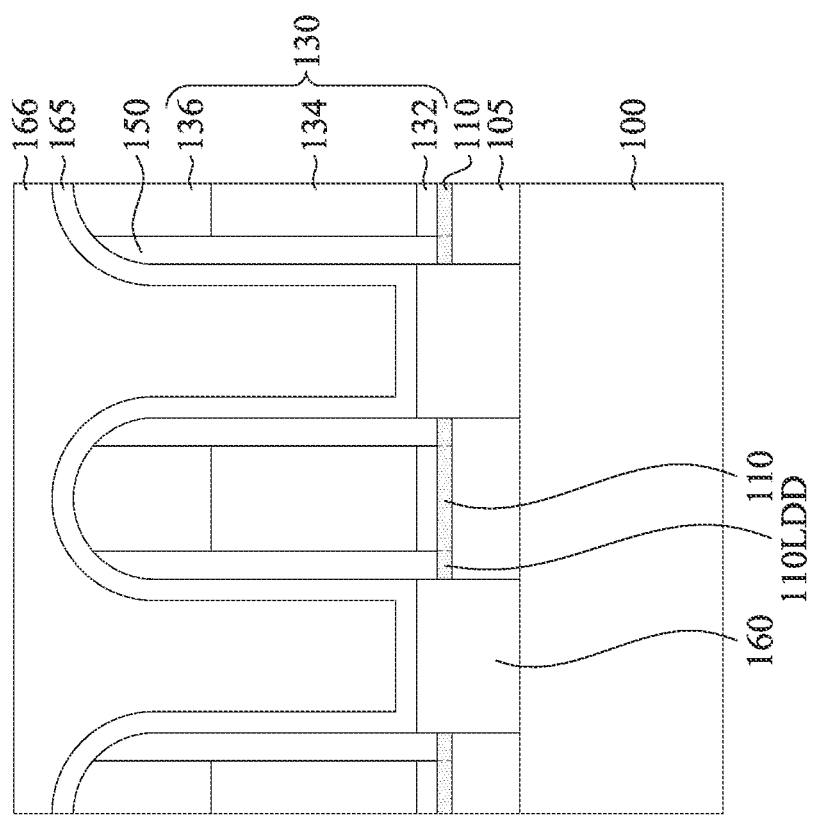

Reference is made to FIG. 10. A contact etch stop layer (CESL) 165 is deposited blanket over the structure of FIG. 9. Afterward, an interlayer dielectric (ILD) layer 166 is deposited over the CESL 165. In some embodiments, the ILD layer 166 may include silicon oxide, silicon nitride, silicon oxynitride, tetraethoxysilane (TEOS), phosphosilicate glass (PSG), borophosphosilicate glass (BPSG), low-k dielectric material, and/or other suitable dielectric materials. Examples of low-k dielectric materials include, but are not limited to, fluorinated silica glass (FSG), carbon doped silicon oxide, amorphous fluorinated carbon, parylene, bis-benzocyclobutenes (BCB), or polyimide. In some embodiments, the CESL 165 and the ILD layer 166 can be deposited by CVD, plasma-enhanced CVD (PECVD), atomic layer deposition (ALD), plasma-enhanced ALD (PEALD) or the like, or combinations thereof.

Figure 11:
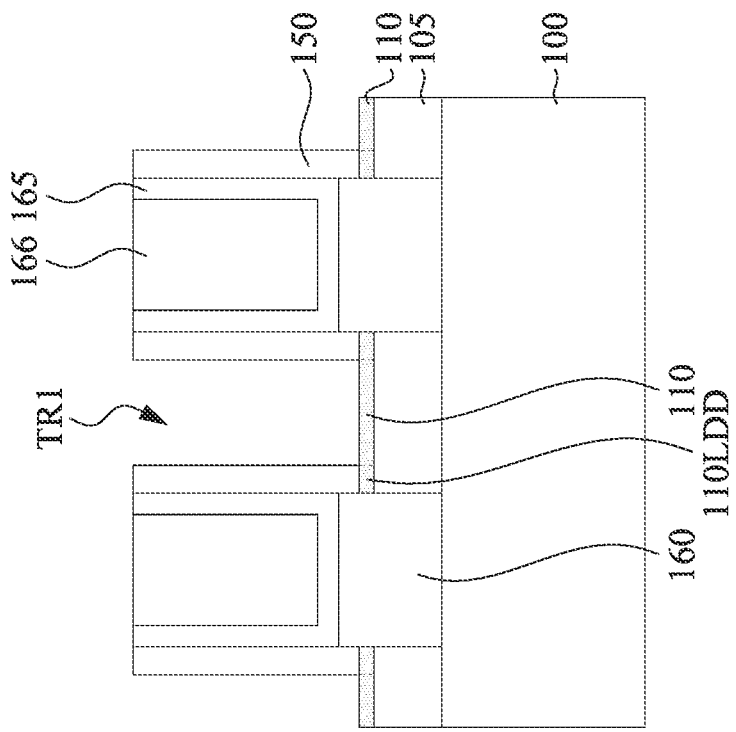

Reference is made to FIG. 11. A chemical mechanism polishing (CMP) process is performed to remove excess materials of the CESL 165 and the ILD layer 166 until top surfaces of the dummy gate structures 130 (see FIG. 10) are exposed. Afterward, an etching process is performed to remove the dummy gate structures 130 to expose the CNT 110. As a result of the etching process, gate trenches TR1 are formed between the gate spacers 150. In some embodiments, the dummy gate structures 130 may be removed by a suitable process, such as wet etch, dry etch, or combinations thereof.

Figure 12:
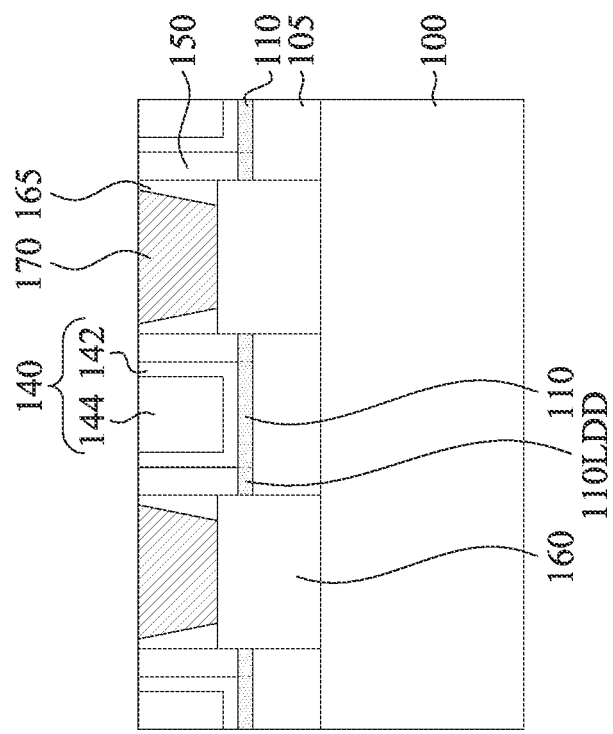

Reference is made to FIG. 12. Metal gate structures 140, which include a gate dielectric layer 142 and a gate electrode 144, are formed in the gate trenches TR1. In some embodiments, the metal gate structures 140 can be formed by, for example, depositing material(s) of the gate dielectric layer 142, depositing material(s) of the gate electrode 144 over the material(s) of the gate dielectric layer 142, and subsequently performing a CMP process until the top surface of the ILD layer 166 is exposed. The gate dielectric layer 142 may be formed by PVD, CVD, ALD, or other suitable deposition processes. The gate electrode 144 may be formed by PVD, CVD, ALD, or other suitable deposition processes.

Figure 13:
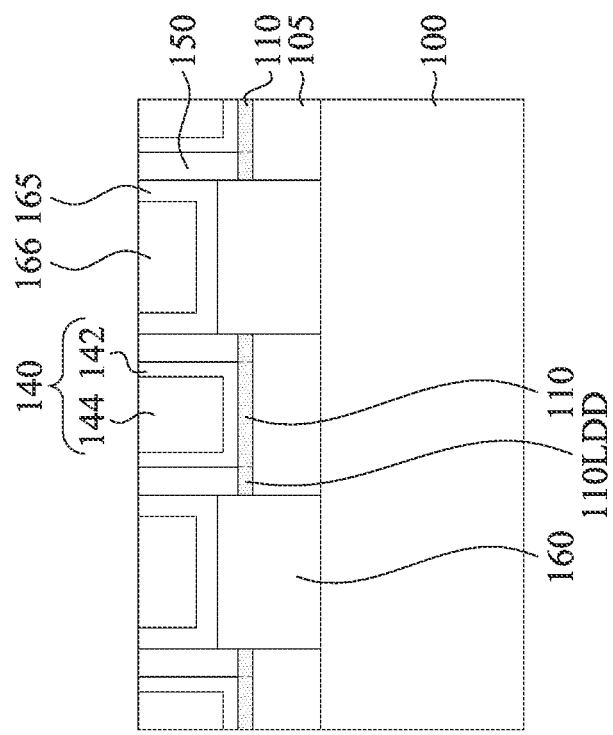

Reference is made to FIG. 13. An etching process is performed to remove portions of the ILD layer 166 and the CESL 165 (see FIG. 12) to form openings that expose top surfaces of the source/drain epitaxy structures 160. Afterwards, source/drain contacts 170 are formed in the openings. In the cross-sectional view of FIG. 13, the etching process may remove an entirety of the ILD layer 166, such that the source/drain contacts 170 may be in contact with the CESL 165. However, in some other embodiments, portions of the ILD layer 166 may remain in the cross-sectional view of FIG. 13, and the remaining ILD layer 166 may be in contact with sidewalls of the source/drain contacts 170. In some embodiments, the source/drain contacts 170 may be formed by PVD, CVD, ALD, or other suitable deposition processes. In some embodiments, prior to forming the source/drain contacts 170, silicide layers (not shown) may be formed over the exposed surfaces of the source/drain epitaxy structures 160. The silicide layers may include NiSi, CoSi and WSi, or the like.

FIGS. 14 to 19 show various stages of a sequential manufacturing operation of a semiconductor device in accordance with some embodiments of the present disclosure. In greater details, FIGS. 14 to 19 illustrate a method for forming the structure shown in FIG. 3C. It is noted that relevant structural details will not be repeated for brevity.

Figure 14:
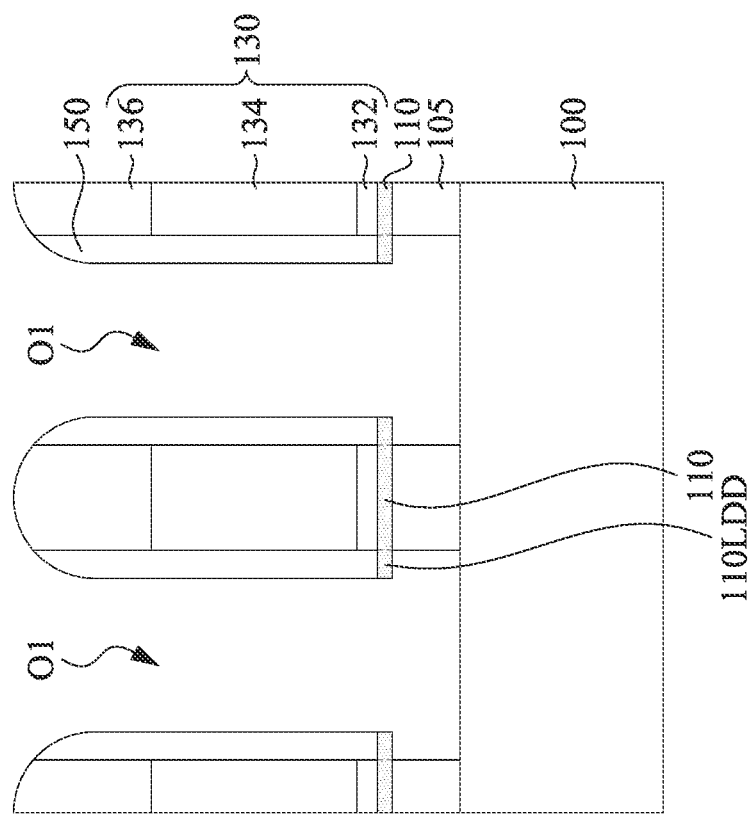

Reference is made to FIG. 14, in which FIG. 14 is a cross-sectional view following the cross-sectional view of FIG. 8. In greater detail, another etching process is performed to the structure shown in FIG. 8, so as to laterally trim the dielectric layer 105. As a result, the openings O1 in the dielectric layer 105 may be enlarged as a result of the etching process, and the openings O1 may expose bottom surfaces of the CNT 100. In some embodiments, during the etching process of FIG. 14, the CNT 110 and the gate spacers 150 may include higher etching resistance to the etching process than the dielectric layer 105. As a result, the dielectric layer 105 may be trimmed while leaving the CNT 110 and the gate spacers 150 substantially intact (or negligible etched) after the etching process is completed. In some embodiments the etching process may be a wet etch. In some embodiments, the dielectric layer 105 may be laterally trimmed by about 1 nm to about 20 nm.

Figure 15:
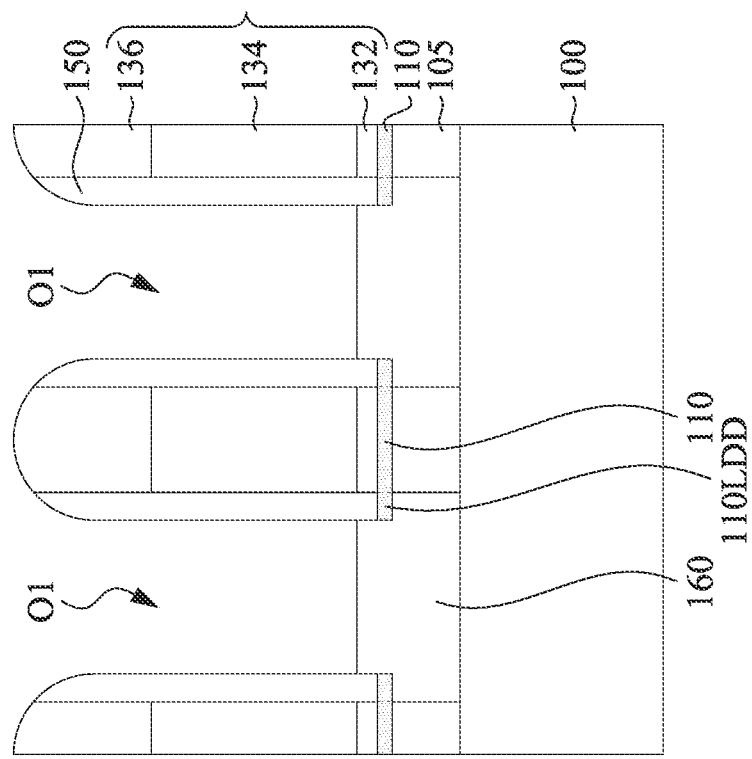
FIGS. 14 to 19 show various stages of a sequential manufacturing operation of a semiconductor device in accordance with some embodiments of the present disclosure.

Reference is made to FIG. 15. Source/drain epitaxy structures 160 are formed in the openings O1 of the dielectric layer 105. The source/drain epitaxy structures 160 may be formed in contact with the exposed bottom surfaces of the CNT 100. In some embodiments, the source/drain epitaxy structures 160 may be formed by selective epitaxial growth (SEG). In some embodiments, the epitaxy structures 160 may be doped with p-type dopants or n-type dopants.

Figure 16:
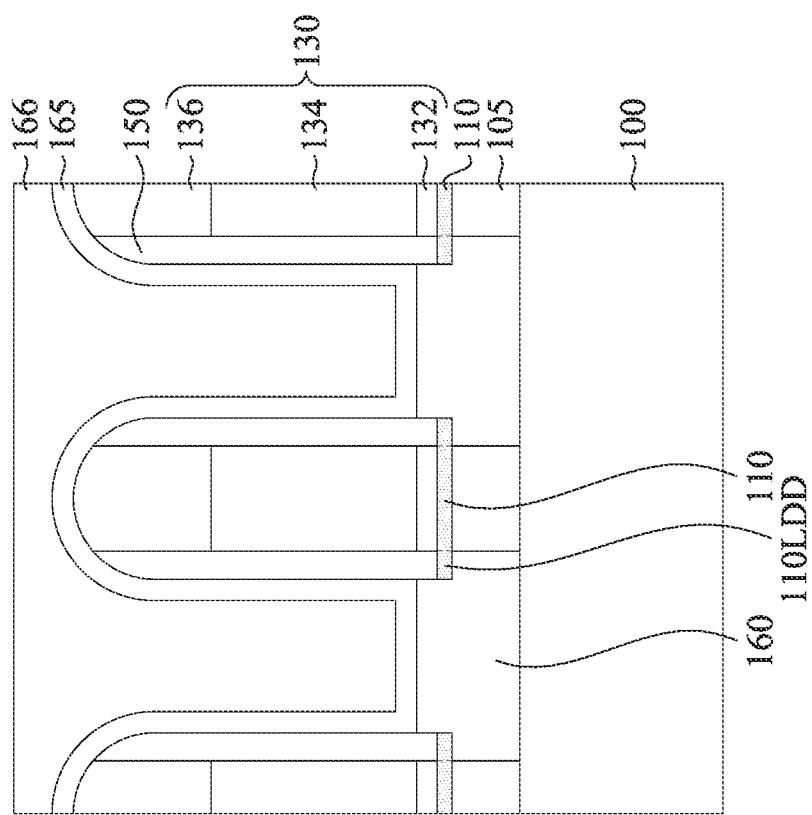

Reference is made to FIG. 16. A contact etch stop layer (CESL) 165 is deposited blanket over the structure of FIG. 15. Afterward, an interlayer dielectric (ILD) layer 166 is deposited over the CESL 165.

Figure 17:
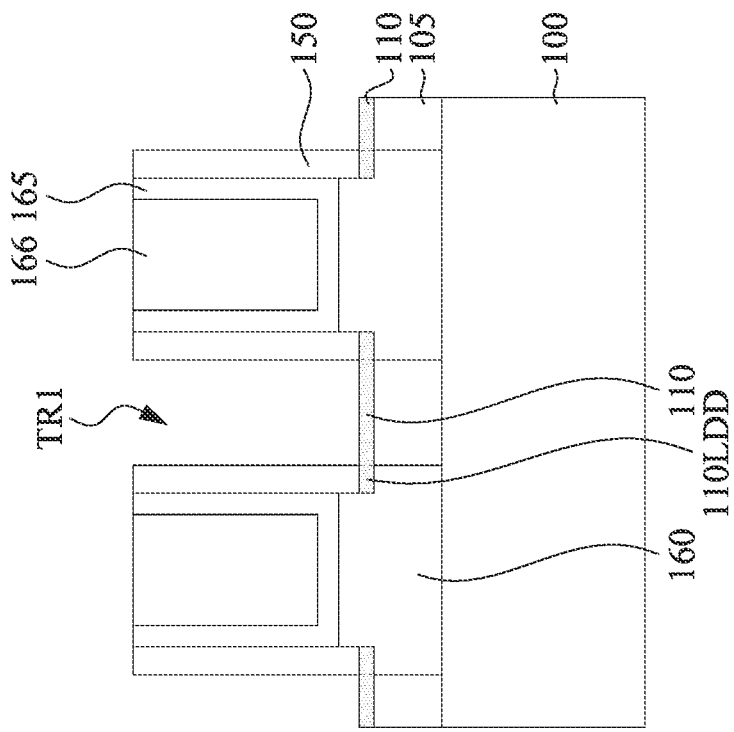

Reference is made to FIG. 17. A chemical mechanism polishing (CMP) process is performed to remove excess materials of the CESL 165 and the ILD layer 166 until top surfaces of the dummy gate structures 130 (see FIG. 16) are exposed. Afterward, an etching process is performed to remove the dummy gate structures 130 to expose the CNT 110. As a result of the etching process, gate trenches TR1 are formed between the gate spacers 150.

Figure 18:
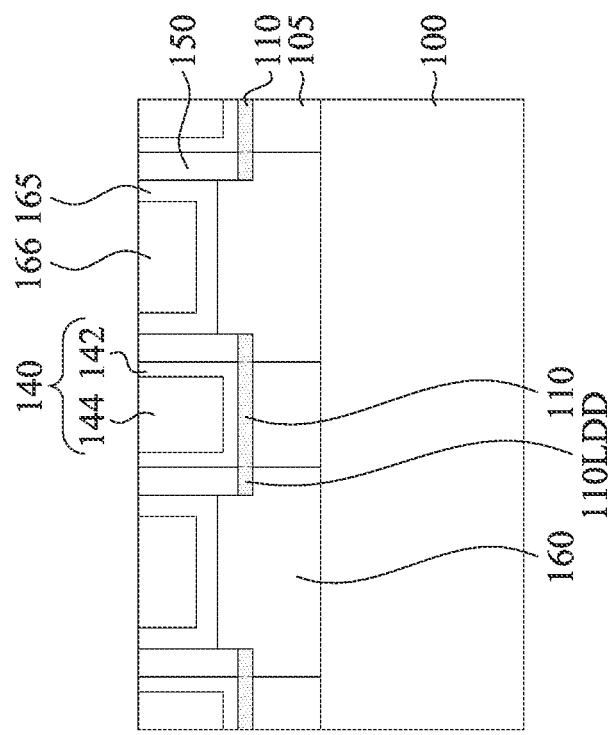

Reference is made to FIG. 18. Metal gate structures 140, which include a gate dielectric layer 142 and a gate electrode 144, are formed in the gate trenches TR1. In some embodiments, the metal gate structures 140 can be formed by, for example, depositing material(s) of the gate dielectric layer 142, depositing material(s) of the gate electrode 144 over the material(s) of the gate dielectric layer 142, and subsequently performing a CMP process until the top surface of the ILD layer 166 is exposed.

Figure 19:
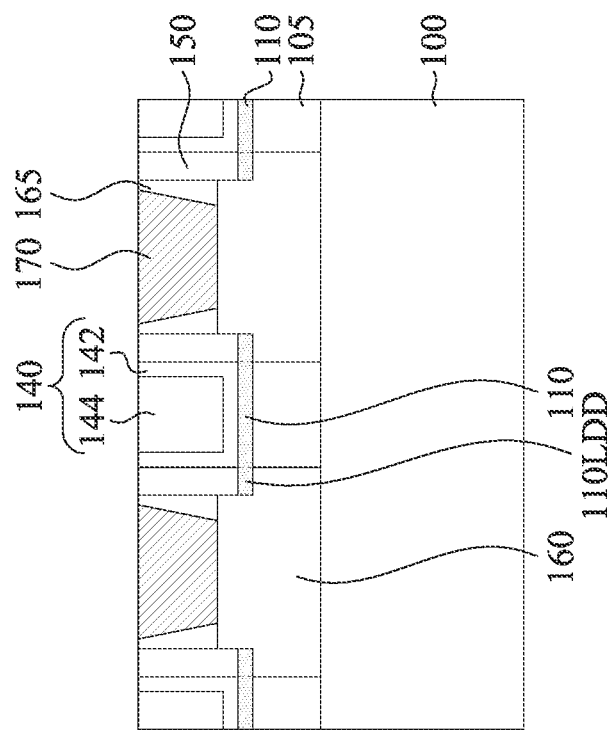

Reference is made to FIG. 19. An etching process is performed to remove portions of the ILD layer 166 and the CESL 165 (see FIG. 18) to form openings that expose top surfaces of the source/drain epitaxy structures 160. Afterwards, source/drain contacts 170 are formed in the openings.

FIGS. 20 to 25 show various stages of a sequential manufacturing operation of a semiconductor device in accordance with some embodiments of the present disclosure. In greater details, FIGS. 20 to 25 illustrate a method for forming the structure shown in FIG. 1B. It is noted that relevant structural details will not be repeated for brevity.

Figure 20:
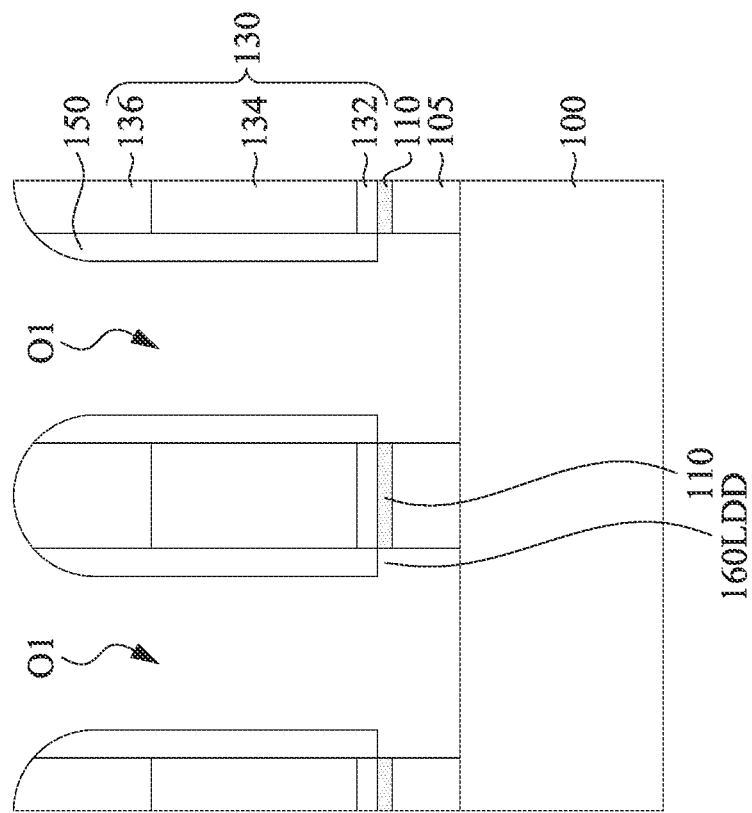

Reference is made to FIG. 20, in which FIG. 20 is a cross-sectional view following the cross-sectional view of FIG. 8. In greater detail, another etching process is performed to the structure shown in FIG. 8, so as to laterally trim the dielectric layer 105 and to laterally trim the CNT 110. As a result, the openings O1 in the dielectric layer 105 may be enlarged and the bottom surfaces of the gate spacers 150 may be exposed as a result of the etching process. In some embodiments, the dielectric layer 105 and the CNT 110 may be laterally trimmed by about 1 nm to about 20 nm.

In some embodiments, the etching process may include a first step and a second step. For example the first step may include using a first etchant that has a higher etching rate to the CNT 100 than to the dielectric layer 105, so as to trim the CNT 100 while leaving the dielectric layer 105 substantially intact (or negligible etched). The second step may include using a second etchant that has a higher etching rate to the dielectric layer 105 than to the CNT 100, so as to trim dielectric layer 105 while leaving the CNT substantially intact (or negligible etched). The first step may be performed prior to or after the second step. Although in the embodiments of FIG. 20, the dielectric layer 105 and the CNT 100 are trimmed equally, the dielectric layer 105 and the CNT 100 may be trimmed non-equally in other embodiments.

Figure 21:
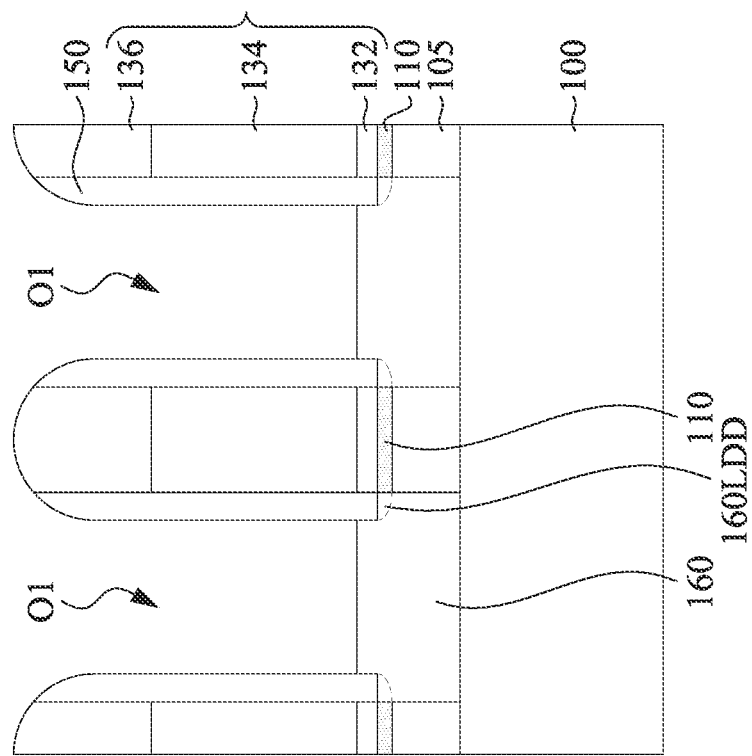
FIGS. 20 to 25 show various stages of a sequential manufacturing operation of a semiconductor device in accordance with some embodiments of the present disclosure.

Reference is made to FIG. 21. Source/drain epitaxy structures 160 are formed in the openings O1 of the dielectric layer 105. The source/drain epitaxy structures 160 may be formed in contact with the exposed bottom surfaces of the gate spacers 150. In some embodiments, the source/drain epitaxy structures 160 may be formed by selective epitaxial growth (SEG). In some embodiments, the epitaxy structures 160 may be doped with p-type dopants or n-type dopants. Examples of p-type dopants can be B, Al, Ga, In, or the like. Examples of n-type dopants can be P, As, Sb, or the like.

In some embodiments, an implantation process may be performed during forming the epitaxy structures 160 to dope the epitaxy structures 160 from top surfaces of the epitaxy structures 160. Accordingly, heavily doped region may be formed in the narrower portion 160N of the epitaxy structures 160. Afterward, an annealing process may be performed to diffuse the dopants in the narrower portion 160N of the epitaxy structures 160 laterally, so as to form lightly-doped region 160LDD under the gate spacers 150.

Figure 22:
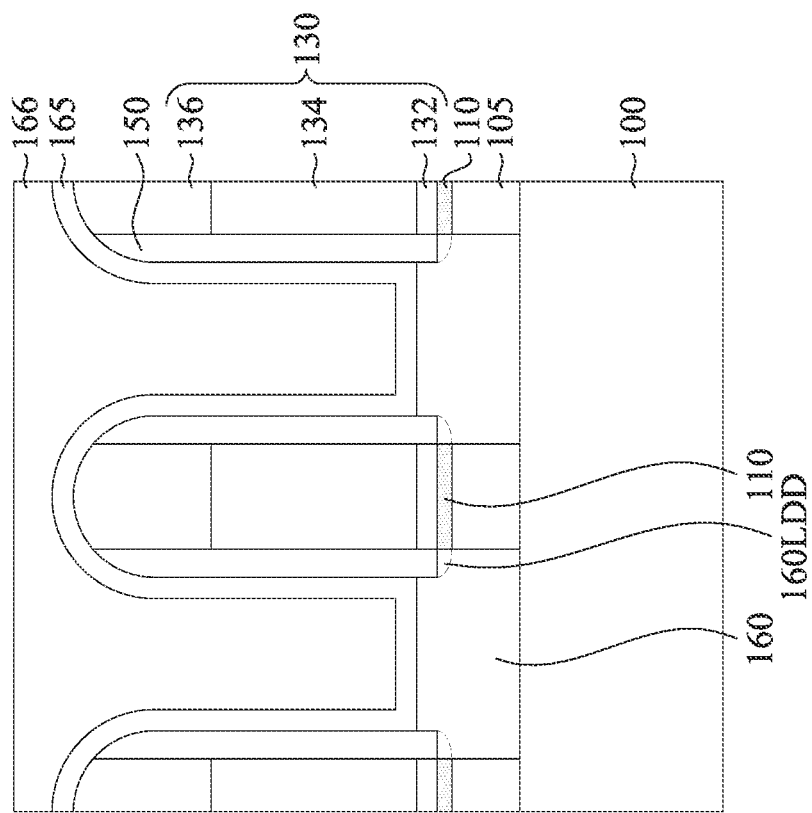

Reference is made to FIG. 22. A contact etch stop layer (CESL) 165 is deposited blanket over the structure of FIG. 15. Afterward, an interlayer dielectric (ILD) layer 166 is deposited over the CESL 165.

Figure 23:
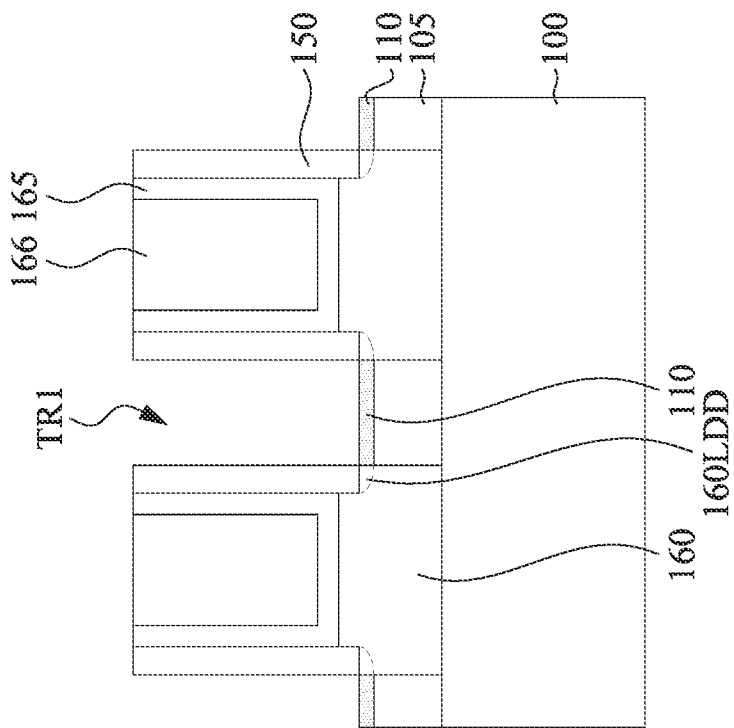

Reference is made to FIG. 23. A chemical mechanism polishing (CMP) process is performed to remove excess materials of the CESL 165 and the ILD layer 166 until top surfaces of the dummy gate structures 130 (see FIG. 22) are exposed. Afterward, an etching process is performed to remove the dummy gate structures 130 to expose the CNT 110. As a result of the etching process, gate trenches TR1 are formed between the gate spacers 150.

Figure 24:
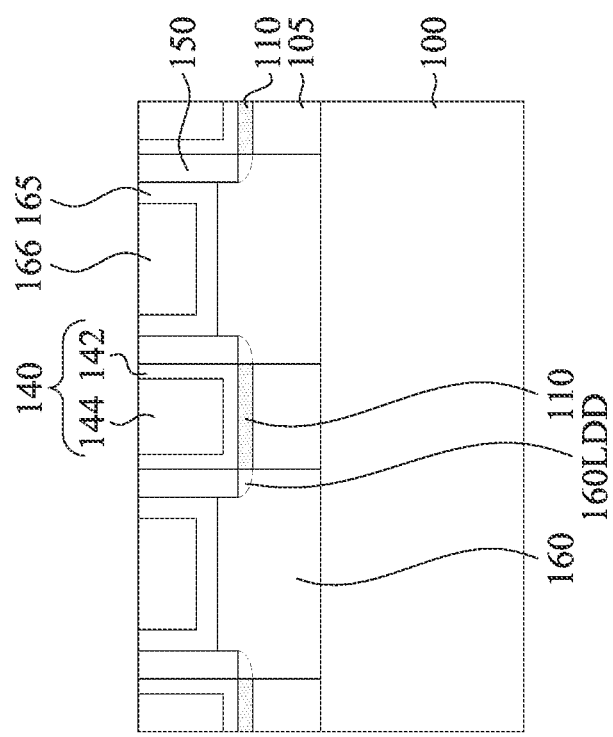

Reference is made to FIG. 24. Metal gate structures 140, which include a gate dielectric layer 142 and a gate electrode 144, are formed in the gate trenches TR1. In some embodiments, the metal gate structures 140 can be formed by, for example, depositing material(s) of the gate dielectric layer 142, depositing material(s) of the gate electrode 144 over the material(s) of the gate dielectric layer 142, and subsequently performing a CMP process until the top surface of the ILD layer 166 is exposed.

Figure 25:
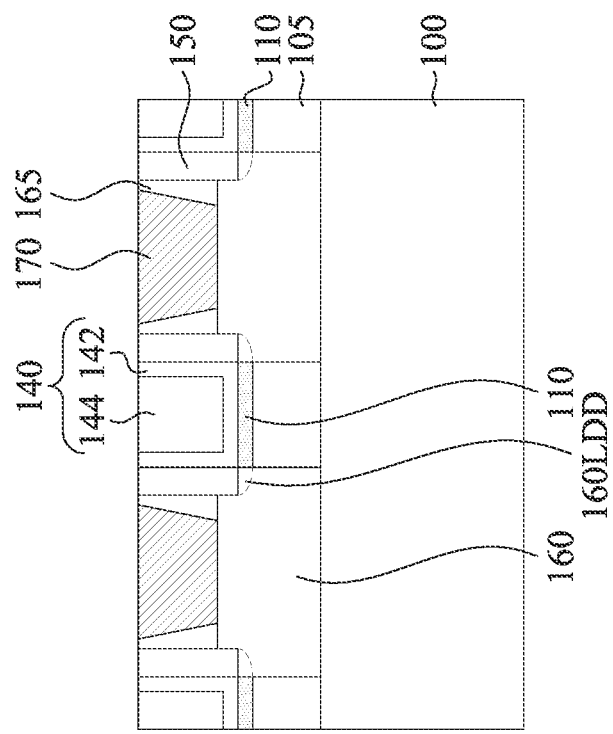

Reference is made to FIG. 25. An etching process is performed to remove portions of the ILD layer 166 and the CESL 165 (see FIG. 24) to form openings that expose top surfaces of the source/drain epitaxy structures 160. Afterwards, source/drain contacts 170 are formed in the openings.

Based on the above discussions, it can be seen that the present disclosure offers advantages. It is understood, however, that other embodiments may offer additional advantages, and not all advantages are necessarily disclosed herein, and that no particular advantage is required for all embodiments. One advantage is that by forming source/drain epitaxy structures on opposite sides of a CNT channel, the contact resistance can be reduced. Moreover, by tuning a diameter of the CNT channel, by forming lightly-doped regions in the source/drain epitaxy structures, or by forming lightly-doped regions in the CNT channel can further achieve band alignment between the CNT channel and the source/drain epitaxy structures, which will further reduce the contact resistance, and will further improve the device performance.

In some embodiments of the present disclosure, a method includes forming a dielectric layer over a substrate; forming a carbon nanotube (CNT) over the dielectric layer; forming a dummy gate structure over the CNT; forming gate spacers on opposite sidewalls of the dummy gate structure; forming source/drain epitaxy structures on opposite sides of the dummy gate structure and in contact with opposite sidewalls of the CNT; replacing the dummy gate structure with a metal gate structure; and forming source/drain contacts over the source/drain epitaxy structures, respectively.

In some embodiments, the method further includes etching the CNT to expose bottom surfaces of the gate spacers, in which the source/drain epitaxy structures are formed in contact with the bottom surfaces of the gate spacers.

In some embodiments, the method further includes performing an annealing process to diffuse dopants of the source/drain epitaxy structures to form lightly-doped regions in the source/drain epitaxy structures, in which the lightly-doped regions are vertically under the gate spacers and are in contact with the CNT.

In some embodiments, the method further includes forming lightly-doped regions in opposite ends of the CNT that are uncovered by the dummy gate structure.

In some embodiments, the method further includes etching the dielectric layer to expose a bottom surface of the CNT, in which the source/drain epitaxy structures are formed in contact with the bottom surface of the CNT.

In some embodiments, etching the dielectric layer is performed to expose a top surface of the substrate.

In some embodiments, the method further includes etching the CNT and the dielectric layer to shorten the CNT and the dielectric layer after forming the gate spacers and prior to forming the source/drain epitaxy structures.

In some embodiments of the present disclosure, a method includes forming a dielectric layer over a substrate; forming a carbon nanotube (CNT) over the dielectric layer; forming a dummy gate structure over the CNT; forming source/drain epitaxy structures on opposite sides of the dummy gate structure and on opposite sides of the CNT, in which forming the CNT and forming the source/drain epitaxy structures includes tuning a conduction band of the CNT and conduction bands of the source/drain epitaxy structures, such that the conduction band of the CNT is aligned with the conduction bands of the source/drain epitaxy structures; and replacing the dummy gate structure with a metal gate structure.

In some embodiments, a diameter of the CNT is in a range from about 0.7 nm to about 2.0 nm.

In some embodiments, tuning the conduction band of the CNT includes forming lightly doped regions in opposite ends of the CNT that are uncovered by the gate spacers.

In some embodiments, tuning the conduction bands of the source/drain epitaxy structures includes doping the source/drain epitaxy structures.

In some embodiments, tuning the conduction bands of the source/drain epitaxy structures further includes performing an annealing process to form lightly doped regions in the source/drain epitaxy structures and in contact with the CNT.

In some embodiments, the method further includes etching the CNT to expose bottom surfaces of the gate spacers, in which each of the source/drain structures has a wider portion in contact with the bottom surface of a corresponding one of the gate spacers, and a narrower portion in contact with a sidewall of the corresponding one of the gate spacers, in which the narrower portion has a smaller width than the wider portion.

In some embodiments, the method further includes etching the dielectric layer to expose a bottom surface of the CNT, in which each of the source/drain structures has a wider portion in contact with the bottom surface of the CNT, and has a narrower portion in contact with a sidewall of the CNT, in which the narrower portion has a smaller width than the wider portion.

In some embodiments of the present disclosure, a device includes a substrate, a dielectric layer, carbon nanotubes (CNTs), a gate structure, gate spacers, source/drain epitaxy structures, and source/drain contacts. The dielectric layer is over the substrate. The CNTs are over the dielectric layer. The gate structure is over the substrate, in which the gate structure covers the CNTs from a top view. The gate spacers are on opposite sidewalls of the gate structure. The source/drain epitaxy structures are over the substrate and on opposite sides of the gate structure, in which in a cross-sectional view, the source/drain epitaxy structures are in contact with opposite ends of the CNTs and opposite sidewalls of the dielectric layer. The source/drain contacts are over the source/drain epitaxy structures, respectively.

In some embodiments, the source/drain epitaxy structures are in contact with bottom surfaces of the gate spacers, respectively.

In some embodiments, each of the CNTs is wider than the dielectric layer.

In some embodiments, the source/drain epitaxy structures are in contact with the substrate.

In some embodiments, the source/drain epitaxy structures include lightly-doped regions under the gate spacers.

In some embodiments, a diameter of each of the CNTs is in a range from about 0.7 nm to about 2.0 nm.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   forming a dielectric layer over a substrate;
   forming a carbon nanotube (CNT) over the dielectric layer;
   forming a dummy gate structure over the CNT;
   forming gate spacers on opposite sidewalls of the dummy gate structure;
   after forming the gate spacers, etching the CNT and the dielectric layer to shorten the CNT and the dielectric layer;
   after etching the CNT and the dielectric layer, forming source/drain epitaxy structures on opposite sides of the dummy gate structure and in contact with opposite sidewalls of the CNT;
   replacing the dummy gate structure with a metal gate structure; and
   forming source/drain contacts over the source/drain epitaxy structures, respectively.

2. The method of claim 1, wherein etching the CNT and the dielectric layer is performed to expose bottom surfaces of the gate spacers, wherein the source/drain epitaxy structures are formed in contact with the bottom surfaces of the gate spacers.

3. The method of claim 2, further comprising performing an annealing process to diffuse dopants of the source/drain epitaxy structures to form lightly-doped regions in the source/drain epitaxy structures, wherein the lightly-doped regions are vertically under the gate spacers and are in contact with the CNT.

4. The method of claim 1, further comprising forming lightly-doped regions in opposite ends of the CNT that are uncovered by the dummy gate structure.

5. The method of claim 1, wherein etching the CNT and the dielectric layer is performed to expose a top surface of the substrate.

6. A method, comprising:
   forming a dielectric layer over a substrate;
   forming a carbon nanotube (CNT) over the dielectric layer;
   forming a dummy gate structure over the CNT;
   forming gate spacers on opposite sidewalls of the dummy gate structure;
   etching the dielectric layer to expose a bottom surface of the CNT;
   forming source/drain epitaxy structures on opposite sides of the dummy gate structure and on opposite sides of the CNT, wherein forming the CNT and forming the source/drain epitaxy structures comprises tuning a conduction band of the CNT and conduction bands of the source/drain epitaxy structures, such that the conduction band of the CNT is aligned with the conduction bands of the source/drain epitaxy structures, wherein one of the source/drain epitaxy structures has a wider portion under the bottom surface of the CNT or a bottom surface of one of the gate spacers, and has a narrower portion alongside a sidewall of the CNT or a sidewall of the one of the gate spacers, wherein the narrower portion has a smaller width than the wider portion; and replacing the dummy gate structure with a metal gate structure.

7. The method of claim 6, wherein a diameter of the CNT is in a range from about 0.7 nm to about 2.0 nm.

8. The method of claim 6, wherein tuning the conduction band of the CNT comprises forming lightly doped regions in opposite ends of the CNT that are uncovered by the gate spacers.

9. The method of claim 6, wherein tuning the conduction bands of the source/drain epitaxy structures comprises doping the source/drain epitaxy structures.

10. The method of claim 9, wherein tuning the conduction bands of the source/drain epitaxy structures further comprises performing an annealing process to form lightly doped regions in the source/drain epitaxy structures and in contact with the CNT.

11. A method, comprising:
forming carbon nanotubes (CNTs) over a dielectric layer on a substrate;
forming a dummy gate structure over the substrate and covering the CNTs;
forming gate spacers on opposite sidewalls of the dummy gate structure;
after forming the gate spacers, etching the CNTs and the dielectric layer;
after etching the CNTs and the dielectric layer, forming source/drain structures over the substrate, wherein in a cross-sectional view, the source/drain structures are in contact with opposite ends of the CNTs and opposite sidewalls of the dielectric layer; and
forming a gate structure over the substrate and covering the CNTs.

12. The method of claim 11, wherein the CNTs are arrange along a horizontal direction.

13. The method of claim 11, wherein in the cross-sectional view, one of the CNTs is wider than the dielectric layer.

14. The method of claim 11, wherein the source/drain structures are in contact with the substrate.

15. The method of claim 11, wherein a diameter of each of the CNTs is in a range from about 0.7 nm to about 2.0 nm.

16. The method of claim 11, wherein etching the CNTs and the dielectric layer is performed to expose bottom surfaces of the gate spacers.

17. The method of claim 11, wherein etching the CNTs and the dielectric layer is performed to expose a top surface of the substrate.

18. The method of claim 11, wherein in the cross-sectional view, one of the source/drain structures has a wider portion under a bottom surface of one of the CNTs, and has a narrower portion alongside a sidewall of the one of the CNTs, wherein the narrower portion has a smaller width than the wider portion.

19. The method of claim 11, wherein in the cross-sectional view, one of the source/drain structures has a wider portion under a bottom surface of a corresponding one of the gate spacers, and a narrower portion alongside a sidewall of the corresponding one of the gate spacers, wherein the narrower portion has a smaller width than the wider portion.

20. The method of claim 11, further comprising forming source/drain contacts over the source/drain structures, respectively.

* * * * *